(12) United States Patent
Kawamura et al.

(10) Patent No.: US 8,043,705 B2
(45) Date of Patent: Oct. 25, 2011

(54) RESIN SUBSTRATE MATERIAL, ELECTRONIC COMPONENT SUBSTRATE MATERIAL MANUFACTURED BY ELECTROLESS PLATING ON THE SAME, AND METHOD FOR MANUFACTURING ELECTRONIC COMPONENT SUBSTRATE MATERIAL

(75) Inventors: Toshifumi Kawamura, Kitaibaraki (JP); Toru Imori, Kitaibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 1003 days.

(21) Appl. No.: 11/795,355

(22) PCT Filed: Feb. 27, 2006

(86) PCT No.: PCT/JP2006/303598
§ 371 (c)(1), (2), (4) Date: Jul. 13, 2007

(87) PCT Pub. No.: WO2006/095589
PCT Pub. Date: Sep. 14, 2006

(65) Prior Publication Data
US 2008/0138629 A1    Jun. 12, 2008

(30) Foreign Application Priority Data

Mar. 10, 2005 (JP) ................................. 2005-066603
Aug. 30, 2005 (JP) ................................. 2005-248706

(51) Int. Cl.
*B32B 15/08* (2006.01)
*B32B 27/16* (2006.01)
*B32B 27/24* (2006.01)
*B32B 27/26* (2006.01)

(52) U.S. Cl. ........ 428/413; 428/416; 428/447; 428/457; 428/473.5

(58) Field of Classification Search ........................ None
See application file for complete search history.

(56) References Cited

U.S. PATENT DOCUMENTS

| 4,024,305 | A  | * | 5/1977 | Alpaugh et al. | ............... | 427/381 |
| 6,780,467 | B2 |   | 8/2004 | Imori |  |  |
| 2004/0182714 | A1 | * | 9/2004 | Imori et al. | ................... | 205/123 |

FOREIGN PATENT DOCUMENTS

| JP | 05-186479 |   | 7/1993 |
| JP | 08039728 | A * | 2/1996 |
| JP | 2000-313963 |   | 11/2000 |
| JP | 2002-30216 |   | 1/2002 |
| JP | 2002-374055 |   | 12/2002 |
| KR | 2002-075884 |   | 10/2002 |
| WO | WO 01/49898 |   | 7/2001 |
| WO | WO 01/81652 |   | 11/2001 |

OTHER PUBLICATIONS

Derwent abstract for JP 08-039728A, Feb. 1996.*

* cited by examiner

*Primary Examiner* — Ramsey Zacharia
(74) *Attorney, Agent, or Firm* — Flynn, Thiel, Boutell & Tanis, P.C.

(57) ABSTRACT

There is provided a technology that can be applied as a substrate material to ordinary resin substrate materials and allows the adhesive strength between this substrate material and a plating metal layer to be increased; more specifically, there is provided an ordinary resin substrate material with an increased adhesive strength between the substrate material and a plating metal layer. The present invention relates to a resin substrate material such as an epoxy resin whose surface is swellable in a solution containing imidazolesilane and a palladium or other noble metal compound having a catalytic action in electroless plating and which has been surface-treated with the solution, and to an electronic component substrate material manufactured by performing electroless plating on this resin substrate material.

11 Claims, No Drawings

RESIN SUBSTRATE MATERIAL, ELECTRONIC COMPONENT SUBSTRATE MATERIAL MANUFACTURED BY ELECTROLESS PLATING ON THE SAME, AND METHOD FOR MANUFACTURING ELECTRONIC COMPONENT SUBSTRATE MATERIAL

TECHNICAL FIELD

The present invention relates to a resin substrate material that is particularly useful as an electronic component substrate material and, and more particularly, relates to a resin substrate material that is useful as an electronic component substrate material with which an electroless plating layer can be formed with a good adhesion to the resin layer.

BACKGROUND ART

The wiring density of printed boards has been steadily rising in recent years because of the need for devices to be smaller and offer a higher performance. This has resulted in the wiring on boards being made finer, so the surfaces thereof have been made lower in profile. However, this trend toward lower surface roughness has made it difficult to achieve satisfactory adhesion between substrates and the metal plating films that are formed over the substrates. However, to meet the above-mentioned needs, a further increase in this adhesive strength will be also required.

Various proposals have already been made for how to handle this need. Of these, Patent Documents 1 and 2 disclose that a polyimide resin substrate material is coated with a polyimide resin precursor solution containing a palladium compound, this coating is dried to form a polyimide resin precursor layer, and then this product is irradiated with UV rays in the presence of a hydrogen donor to form nuclei for a primer plating layer, after which a primer plating metal layer is formed by an electroless plating treatment, then a surface plating layer is formed, before or after which the polyimide resin precursor layer is heated and imidized to create a polyimide resin layer. Forming the nuclei for the primer plating layer within the polyimide resin layer here provides an anchor effect that improves the adhesive strength between the polyimide resin layer and the plating substrate metal layer.

Patent Document 1: *Japanese Patent Publication* 2002-30216A

Patent Document 2: *Japanese Patent Publication* 2002-374055A

DISCLOSURE OF THE INVENTION

Problems that the Invention is to Solve

However, with the proposals discussed above, the board material is limited to a polyimide resin, and cannot be generally applied to electronic component boards. Also, a UV treatment is required to activate the palladium, high-temperature heating is required for imidization, and so forth, so the treatment process ends up being complicated.

The present invention provides technology that can be applied as a substrate material to ordinary resin substrate materials and allows the adhesive strength between this substrate material and a plating metal layer to be increased. More specifically, it provides an ordinary resin substrate material that is useful as an electronic component substrate material with an increased adhesive strength between itself and a plating metal layer.

Means for Solving the Problems

As a result of diligent research, the inventors arrived at the present invention upon discovering that it is effective to use a solution containing a noble metal compound, which is a catalyst for electroless plating, and imidazolesilane, which is able to capture this noble metal compound, to treat a surface that can be swollen with the solution. Specifically, the present invention relates to the following:

(1) A resin substrate material whose surface is swellable in a solution containing imidazolesilane and a noble metal compound and which has been surface-treated with the solution.

(2) A resin substrate material which has been surface-treated with a solution containing imidazolesilane and a noble metal compound while the surface of the resin substrate material is swollen by the solution.

(3) The resin substrate material surface-treated according to (1) or (2) above, wherein the resin substrate material is at a B stage.

(4) The resin substrate material surface-treated according to any one of (1) to (3) above, wherein the resin substrate material is an epoxy resin.

(5) The resin substrate material surface-treated according to any one of (1) to (4) above, wherein the noble metal compound is a palladium compound.

(6) An electronic component substrate material manufactured by performing electroless plating on the resin substrate material surface-treated according to any one of (1) to (5) above.

(7) The electronic component substrate material according to (6) above, wherein the resin substrate material is an epoxy resin.

(8) The electronic component substrate material according to (6) or (7) above, wherein the electronic component substrate material is a build-up substrate.

(9) A method for manufacturing an electronic component substrate material, comprising a step of performing electroless plating on a resin substrate material whose surface is swellable in a solution containing imidazolesilane and a noble metal compound and which has been surface-treated with the solution.

(10) The method for manufacturing an electronic component substrate material according to (9) above, wherein the resin substrate material is an epoxy resin.

(11) The method for manufacturing an electronic component substrate material according to (9) or (10) above, wherein the electronic component substrate material is a build-up substrate.

Effects of the Invention

With the present invention, the surface of a resin substrate material is swollen by a solution containing imidazolesilane and a noble metal compound in the course of surface treatment with this solution, so a noble metal catalyst can get into and reside in the resin layer farther inward than the surface. Accordingly, when this resin substrate material is subjected to electroless plating, the metal will also be deposited even into the interior of the resin layer. The anchor effect of this plating metal layer increases the adhesive strength between the resin layer of the resin substrate material and the metal layer formed by electroless plating.

BEST MODE FOR CARRYING OUT THE INVENTION

There are no particular restrictions on the resin substrate material used in the present invention as long as it is a resin substrate material whose surface will be swollen by surface treatment with a solution containing imidazolesilane and a noble metal compound by the action described above, but examples include an epoxy resin, phenol resin, polyurethane resin, melamine resin, and silicone resin. If the resin is a thermosetting resin, it is preferably what is known as a B stage resin, which is at a stage prior to reaching complete curing but is easily swollen by surface treatment with the above-mentioned solution.

An epoxy resin is particularly favorable as the resin substrate material in the present invention. Examples of epoxy resins include diglycidyl ether compounds, such as bisphenol A, bisphenol F, and other such bisphenols (bisphenol-type epoxy resins); resins that have been modified on a side chain or the main chain with a flexible resin, such as rubbers, urethanes, polyethers, polyesters and so forth; glycidyl ether compounds of phenol novolac, cresol novolac, and so forth (novolac-type epoxy resins); and polybutadiene and other such conjugated diene polymer epoxy compounds.

Compounds expressed by the following Formulas (1), (2), and (3), which are able to capture a noble metal compound, are preferable as the imidazolesilane used in the present invention.

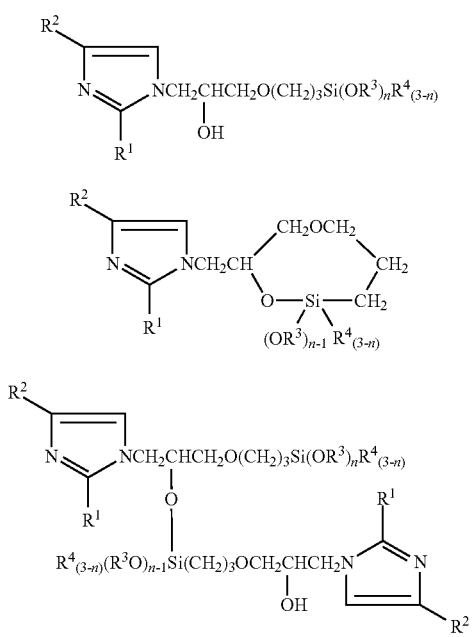

(Where $R^1$ is a hydrogen or a $C_1$ to $C_{20}$ alkyl group, $R^2$ is a hydrogen, a vinyl group, or a $C_1$ to $C_5$ alkyl group, $R^3$ and $R^4$ are each a $C_1$ to $C_3$ alkyl group, and n is a number from 1 to 3.)

$R^1$ to $R^4$ in the above Formulas (1), (2), and (3) are defined as above, but in terms of the ease of synthesis, it is particularly favorable for $R^1$ to be a hydrogen, methyl, ethyl, undecyl, or heptadecyl, for $R^2$ to be a hydrogen, methyl, or ethyl, and for $R^3$ and $R^4$ to be a methyl or ethyl.

A method for synthesizing these compounds is disclosed in Japanese Patent Publication 5-186479A.

Specifically, they can be synthesized by an equimolar reaction of the following imidazole compound (General Formula (4)) and 3-glycidoxypropylsilane compound (General Formula (5)). Even when a mixture of the imidazolesilanes expressed by the above Formulas (1), (2), and (3) is obtained by this synthesis method, there is no particular need to separate the compounds, so there is the advantage that they can be used in the form of a mixture.

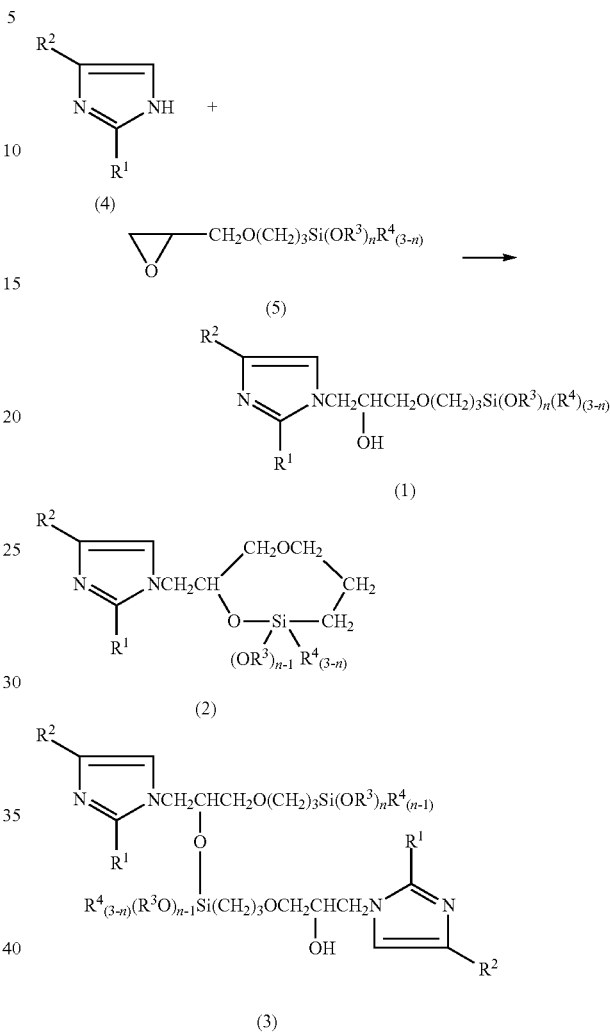

(Where $R^1$ is a hydrogen or a $C_1$ to $C_{20}$ alkyl group, $R^2$ is a hydrogen, a vinyl group, or a $C_1$ to $C_5$ alkyl group, $R^3$ and $R^4$ are each a $C_1$ to $C_3$ alkyl group, and n is a number from 1 to 3.)

Preferable examples of the imidazole compound expressed by General Formula (4) above include imidazole, 2-alkylimidazole, 2,4-dialkylimidazole, and 4-vinylimidazole. Of these, especially favorable examples include imidazole; 2-methylimidazole, 2-ethylimidazole, 2-undecylimidazole, and 2-heptadecylimidazole as 2-alkylimidazoles; and 2-ethyl-4-methylimidazole as a 2,4-dialkylimidazole.

Examples of the 3-glycidoxypropylsilane compound expressed by General Formula (5) above include 3-glycidoxypropyltrialkoxysilanes, 3-glycidoxypropyldialkoxyalkylsilanes, and 3-glycidoxypropylalkoxydialkylsilanes. Of these, especially favorable examples include 3-glycidoxypropyltrimethoxysilane and 3-glycidoxypropyltriethoxysilane as 3-glycidoxypropyltrialkoxysilanes, 3-glycidoxypropyldimethoxymethylsilane as a 3-glycidoxypropyldialkoxyalkylsilane, and 3-glycidoxypropylethoxydimethylsilane as a 3-glycidoxypropylalkoxydialkylsilane.

Any noble metal compound catalyst used in the past in electroless plating can be used as the noble metal compound in the present invention. Examples of this noble metal compound include palladium soaps and ammine complexes such as chlorides, hydroxides, oxides, sulfates, and ammonium salts of palladium, silver, platinum, gold, and the like, all of which exhibit catalytic action in the deposition of metals such as copper or nickel from an electroless plating solution onto the surface of the object being plated. Of these, a palladium compound is preferred, and a palladium soap such as palladium naphthenate is particularly favorable. The noble metal compound is used in a concentration of 1 to 30,000 mg/L, and preferably 10 to 20,000 mg/L, in the above-mentioned treatment solution.

The imidazolesilane used in the present invention is used in a concentration of 1 to 30,000 mg/L, and preferably 10 to 20,000 mg/L, in the above-mentioned treatment solution.

There are no particular restrictions on the solvent used in this treatment solution as long as it will dissolve imidazolesilane and a noble metal compound, and will swell the resin when the resin substrate material is surface treated.

Particularly favorable examples of this solvent include methyl ethyl ketone, octanol, and butanol. Imidazolesilane is insoluble in water, but will dissolve if a mixture of water and an organic solvent such as ethylene glycol is used as the solvent, and an aqueous solution can be formed in this way. A mixed solution of water and ethylene glycol is also favorable as the solvent.

Any ordinary treatment method may be employed for the surface treatment, examples of which include coating and dipping. After the coating or dipping, the solution is dried to remove the solvent.

The adhesive strength can be further increased by roughening the surface by treatment with permanganic acid or the like prior to the above-mentioned surface treatment.

It is preferable to perform treatment with a reducing agent prior to the electroless plating in order to further activate the electroless plating activity of the resin substrate material that has been treated with the noble metal compound and imidazolesilane. Any known reducing agent that is commonly used in electroless plating can be used as this reducing agent, but favorable examples include hypophosphorous acid, sodium hypophosphite and other such alkali metal salts of hypophosphorous acid, and dimethylborane.

There are no particular restrictions on the electroless plating itself in the present invention, and any known method may be used. The electroless plating is preferably copper plating, but may instead be nickel, cobalt, or other plating.

Also, electroplating may be performed after the electroless plating. There are no particular restrictions on the method for this electroplating, and any known technique can be applied. For example, copper, chromium, nickel, silver, or the like can be used.

When a resin that has yet to reach complete curing is used as the substrate material, it is preferable to heat and completely cure the resin after electroplating or after electroless plating.

The present invention encompasses electronic component substrate materials and build-up substrates manufactured by performing electroless plating on a resin substrate material that has been treated with a solution containing a noble metal compound and imidazolesilane.

EXAMPLES

Example 1

5 g of imidazolesilane (the equimolar reaction product of imidazole and 3-glycidoxypropyltrimethoxysilane) and 10 g of palladium naphthenate were dissolved in 1 L of methyl ethyl ketone, and a Baker applicator was used to apply this solution to the surface of an epoxy resin (epoxy resin prepreg, R-1661T made by Matsushita Electric Works, Ltd.) that was in a semi-cured state (cured at 140° C.). The solvent was removed by drying at 120° C. The coating layer was 0.1 µm thick. This product was immersed in a reducing solution containing hypophosphorous acid (phosphinic acid) in a concentration of 30 g/L, then rinsed with water to activate the palladium, after which this product was subjected to electroless copper plating (using a high-temperature formalin-based copper plating solution, KC500 (made by Nikko Metal Plating Co., Ltd.), 0.3 µm thick) and to copper electroplating (copper sulfate plating, 1.5 A/dm$^2$, 35 µm thick). The peel strength after full curing at 170° C. was 1.0 kgf/cm. The peel strength here refers to the 90° peel strength according to JIS C 6481 (the same applies hereinafter). The same process is performed in the following examples.

Example 2

5 g of imidazolesilane (the equimolar reaction product of imidazole and 3-glycidoxypropyltrimethoxysilane) and 10 g of palladium naphthenate were dissolved in 1 L of octanol, and a Baker applicator was used to apply this solution to the surface of an epoxy resin (epoxy resin prepreg, R-1661T made by Matsushita Electric Works, Ltd.) that was in a semi-cured state (cured at 100° C.). The solvent was removed by drying at 120° C., and the coating layer was 0.1 µm thick. This product was immersed in a reducing solution containing hypophosphorous acid (phosphinic acid) in a concentration of 30 g/L, then rinsed with water to activate the palladium, after which this product was subjected to electroless copper plating (using a high-temperature formalin-based copper plating solution, KC500 (made by Nikko Metal Plating Co., Ltd.), 0.3 µm thick) and to copper electroplating (copper sulfate plating, 1.5 A/dm$^2$, 35 µm thick). The peel strength after full curing at 170° C. was 1.2 kgf/cm.

Example 3

5 g of imidazolesilane (the equimolar reaction product of imidazole and 3-glycidoxypropyltrimethoxysilane) and 10 g of palladium naphthenate were dissolved in 1 L of octanol, and a Baker applicator was used to apply this solution to the surface of an epoxy resin (epoxy resin prepreg, R-1661T made by Matsushita Electric Works, Ltd.) that was in a semi-cured state (cured at 140° C.) and had been roughened with permanganic acid. The solvent was removed by drying at 120° C., and the coating layer was 0.1 µm thick. This product was immersed in a reducing solution containing hypophosphorous acid (phosphinic acid) in a concentration of 30 g/L, then rinsed with water to activate the palladium, after which this product was subjected to electroless copper plating (using a high-temperature formalin-based copper plating solution, KC500 (made by Nikko Metal Plating Co., Ltd.), 0.3 µm thick) and to copper electroplating (copper sulfate plating, 1.5 A/dm$^2$, 35 µm thick). The peel strength after full curing at 170° C. was 1.4 kgf/cm.

Example 4

An epoxy resin (epoxy resin prepreg, R-1661T made by Matsushita Electric Works, Ltd.) that was in a semi-cured state (cured at 100° C.) and had been roughened with permanganic acid was immersed in an aqueous solution containing 200 mg/L of imidazolesilane (the equimolar reaction product of imidazole and 3-glycidoxypropyltrimethoxysilane), 100 mg/L of palladium chloride (60 mg/L calculated as palladium), and 30 g/L ethylene glycol. This product was dried at 120° C., after which it was immersed in a reducing solution containing hypophosphorous acid (phosphinic acid) in a concentration of 30 g/L, then rinsed with water to activate the palladium, after which this product was subjected to electroless copper plating (using a high-temperature formalin-based copper plating solution, KC-500 (made by Nikko Metal Plating Co., Ltd.), 0.3 µm thick) and to copper electroplating (copper sulfate plating, 1.5 A/dm$^2$, 35 µm thick). The peel strength after full curing at 170° C. was 1.1 kgf/cm.

Example 5

The same treatment as in Example 1 was performed, except that the epoxy resin was changed to a polyimide resin (BT resin prepreg, GHPL-950K made by Mitsubishi Gas Chemical Co., Inc.). The peel strength was 1.1 kgf/cm.

Comparative Example 1

The same treatment as in Example 1 was performed, except that the epoxy resin (epoxy resin prepreg, R-1661T made by Matsushita Electric Works, Ltd.) was changed to a C stage resin (completely cured). The peel strength was 0.4 kgf/cm.

The invention claimed is:

1. A resin substrate material at a B-stage whose surface at a B-stage is swellable in a solution containing imidazolesilane and a palladium soap in an organic solvent and which has been surface-treated with the solution at a B-stage.

2. The resin substrate material surface-treated according to claim 1, wherein the resin substrate material is an epoxy resin.

3. An electronic component substrate material manufactured by performing electroless plating on the resin substrate material surface-treated at a B-stage according to claim 1.

4. The electronic component substrate material according to claim 3, wherein the resin substrate material is an epoxy resin.

5. The electronic component substrate material according to claim 3, wherein the electronic component substrate material is a build-up substrate.

6. The resin substrate material surface-treated according to claim 1, wherein the resin substrate material is an epoxy resin or a polyimide resin, the imidazolesilane is a reaction product of imidazole and 3-glycidoxypropyltrimethoxy silane, the palladium soap is palladium naphthanate and the organic solvent is selected from the group consisting of methylethylketone, octanol and ethylene glycol.

7. A resin substrate material at a B-stage which has been surface-treated with a solution containing imidazolesilane and a palladium soap in an organic solvent while the surface of the resin substrate material at a B-stage is swollen by the solution.

8. The resin substrate material surface-treated according to claim 7, wherein the resin substrate material is an epoxy resin.

9. An electronic component substrate material manufactured by performing electroless plating on the resin substrate material surface-treated and being at a B-stage according to claim 7.

10. The electronic component substrate material according to claim 9, wherein the resin substrate material is an epoxy resin.

11. The electronic component substrate material according to claim 9, wherein the electronic component substrate material is a build-up substrate.

* * * * *